(12) United States Patent
Tofighbakhsh et al.

(10) Patent No.: US 10,127,923 B2
(45) Date of Patent: *Nov. 13, 2018

(54) AUTOMATIC SOUND LEVEL CONTROL

(71) Applicant: AT&T MOBILITY II LLC, Atlanta, GA (US)

(72) Inventors: Mostafa Tofighbakhsh, Cupertino, CA (US); Vinay Kundaje, Flanders, NJ (US); Waliur Rahman, Austin, TX (US)

(73) Assignee: AT&T MOBILITY II LLC, Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/659,104

(22) Filed: Jul. 25, 2017

(65) Prior Publication Data
US 2017/0323654 A1    Nov. 9, 2017

Related U.S. Application Data

(63) Continuation of application No. 15/071,756, filed on Mar. 16, 2016, now Pat. No. 9,741,361, which is a continuation of application No. 13/847,633, filed on Mar. 20, 2013, now Pat. No. 9,318,101, which is a continuation of application No. 12/637,820, filed on Dec. 15, 2009, now Pat. No. 8,428,947.

(51) Int. Cl.
| | |
|---|---|
| G10L 21/034 | (2013.01) |
| G10L 15/30 | (2013.01) |
| G10L 13/00 | (2006.01) |
| G10L 13/08 | (2013.01) |
| G10L 13/04 | (2013.01) |
| H03G 3/32 | (2006.01) |

(52) U.S. Cl.
CPC ............ G10L 21/034 (2013.01); G10L 13/00 (2013.01); G10L 13/043 (2013.01); G10L 13/08 (2013.01); G10L 15/30 (2013.01); H03G 3/32 (2013.01)

(58) Field of Classification Search
CPC ...................................... G10L 21/034
USPC ........................................... 704/225
See application file for complete search history.

(56) References Cited

U.S. PATENT DOCUMENTS

| | | |
|---|---|---|
| 5,007,838 A | 4/1991 | Cochran |
| 5,684,924 A | 11/1997 | Stanley et al. |
| 5,765,179 A | 6/1998 | Sumita et al. |
| 6,839,670 B1 | 1/2005 | Stammler et al. |
| 6,847,931 B2 | 1/2005 | Addison |

(Continued)

OTHER PUBLICATIONS

Bennett, et al., ""iPhone Cool Projects," Springer-Verlang New York, Inc., New York USA, 2009", Bennett, G. et al., "iPhone Cool Projects," Springer-Verlang New York, Inc., New York USA, 2009, pp. 191 through 195.

(Continued)

*Primary Examiner* — Susan McFadden
(74) *Attorney, Agent, or Firm* — Toler Law Group, PC

(57) ABSTRACT

A method includes identifying, by a computing device including a processor, a plurality of words from data. The method includes determining a location of the computing device. The method includes determining, by the computing device, a sound output level based on the location. The method also includes generating, by the computing device, digital sound data based on the sound output level and the plurality of words identified from the data.

20 Claims, 10 Drawing Sheets

(56) References Cited

U.S. PATENT DOCUMENTS

| | | |
|---|---|---|
| 7,240,010 B2 | 7/2007 | Papadimitriou et al. |
| 7,490,042 B2 | 2/2009 | Eide et al. |
| 7,783,028 B2 | 8/2010 | Bantz et al. |
| 8,185,380 B2 | 5/2012 | Kameyama |
| 8,428,947 B2 | 4/2013 | Tofighbakhsh et al. |
| 9,318,101 B2 | 4/2016 | Tofighbakhsh et al. |
| 9,741,361 B2 * | 8/2017 | Tofighbakhsh ....... G10L 21/034 |
| 2011/0144994 A1 | 6/2011 | Tofighbakhsh et al. |

OTHER PUBLICATIONS

Goldstein, ""AppleScript: The Missing Manual," O'Reilly Media, Inc., California USA, Feb. 2005", Goldstein, A., "AppleScript: The Missing Manual," O'Reilly Media, Inc., California USA, Feb. 2005, pp. 221 through 235.

\* cited by examiner

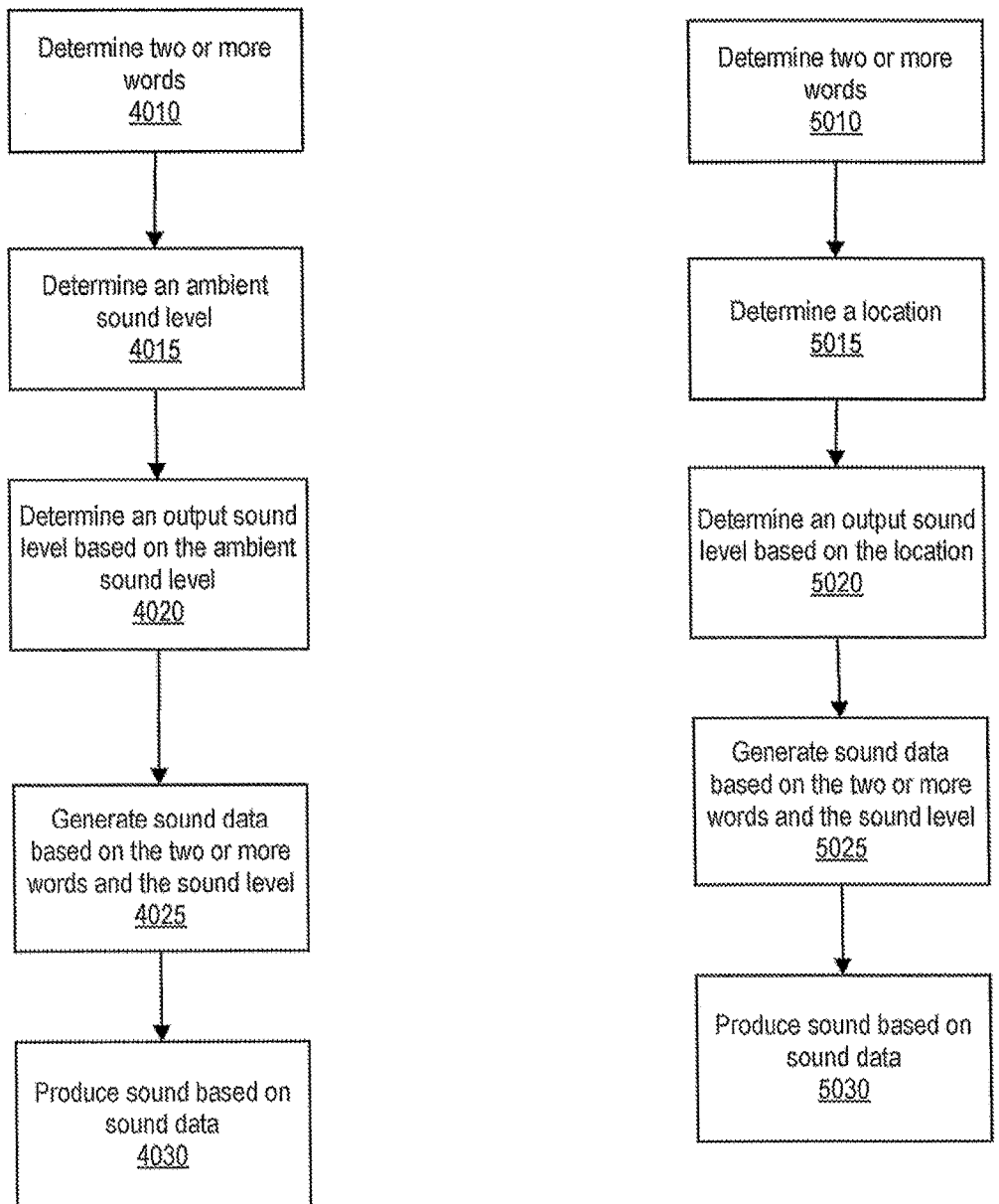

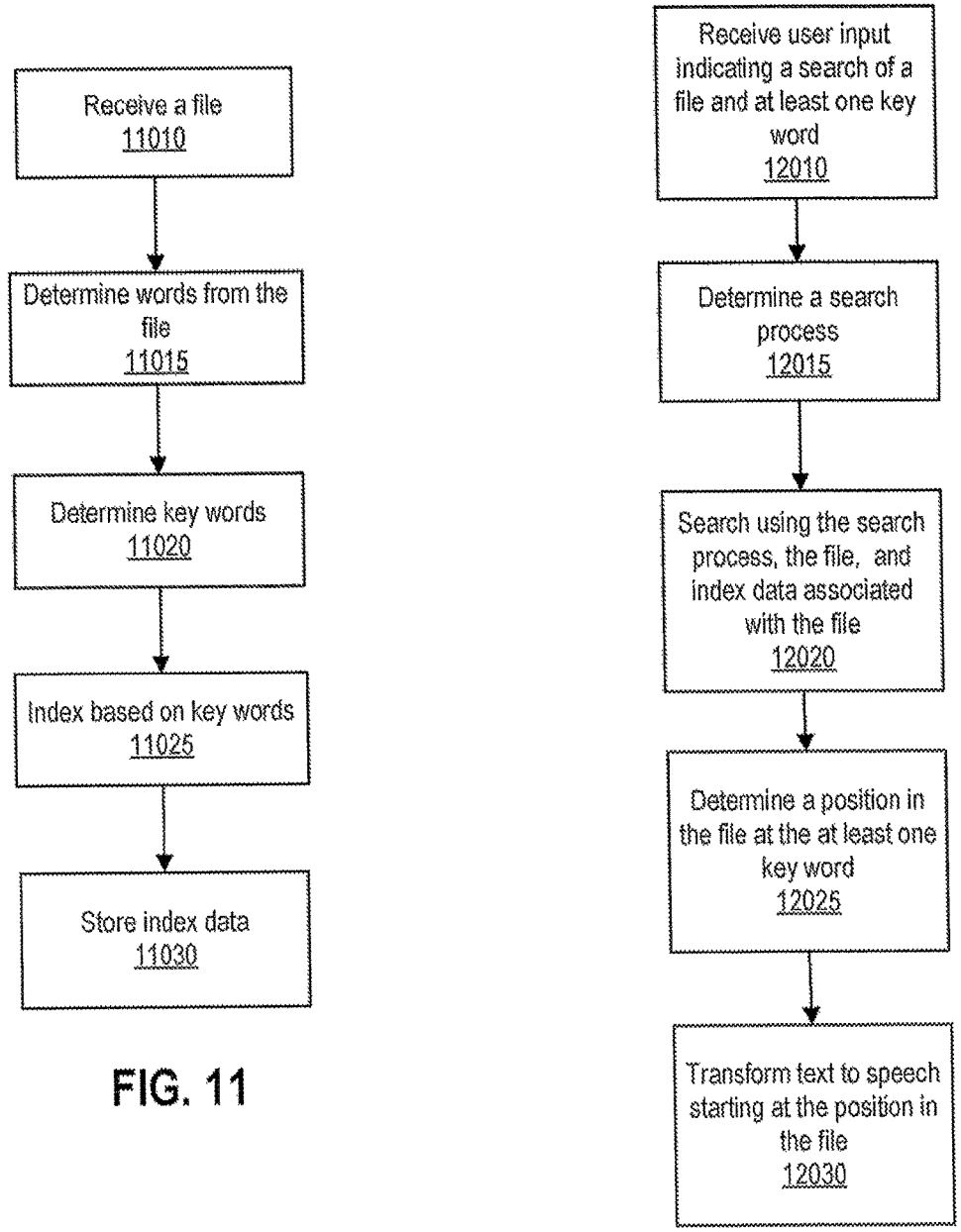

AUTOMATIC SOUND LEVEL CONTROL

CLAIM OF PRIORITY

The present application is a continuation of, and claims priority to, U.S. patent application Ser. No. 15/071,756, filed on Mar. 16, 2016, which is a continuation of U.S. patent application Ser. No. 13/847,633, filed on Mar. 20, 2013, now U.S. Pat. No. 9,318,101, which is a continuation of U.S. patent application Ser. No. 12/637,820, filed on Dec. 15, 2009, now U.S. Pat. No. 8,428,947, the contents of each of which are expressly incorporated herein by reference in their entirety.

TECHNICAL FIELD

This disclosure relates generally to the field of sound level control and, more specifically, this disclosure pertains to the field of automatic sound level control of output sounds emanating from a mobile device or an output coupled to the mobile device

DESCRIPTION OF THE RELATED ART

Mobile devices are used in a variety of environments that can present various ambient noise levels. In one example, an environment at or near a restaurant can present a noise level that is higher than an environment of a cabin of an automobile. In another example, an environment at or near a train platform can present a noise level that is higher than a coffee shop. It can become difficult for a user of a mobile to discern or determine sounds emanating from the mobile device or an output coupled to the mobile device (e.g., a headset) in various environments where the noise level is comparatively higher than other environments unless the mobile device produces sounds at a greater volume. Further, it can become disturbing to the user or others around the user when the mobile device produces sounds at a greater volume in environments where the noise level is comparatively lower than other environments unless the mobile device or an output coupled to the mobile device produces sounds at a lower volume.

BRIEF DESCRIPTION OF THE DRAWINGS

The preferred embodiments will become apparent upon reading the following detailed description and upon reference to the accompanying drawings in which:

FIG. 4 illustrates a method for automatically determining a sound level based on an ambient sound level, according to one or more embodiments;

FIG. 5 illustrates a method for automatically determining a sound level based on a location, according to one or more embodiments;

FIG. 11 illustrates a method of indexing and/or tagging text of a file, according to one or more embodiments; and FIG. 12 illustrates a method of searching a file, according to one or more embodiments.

Figure 1:
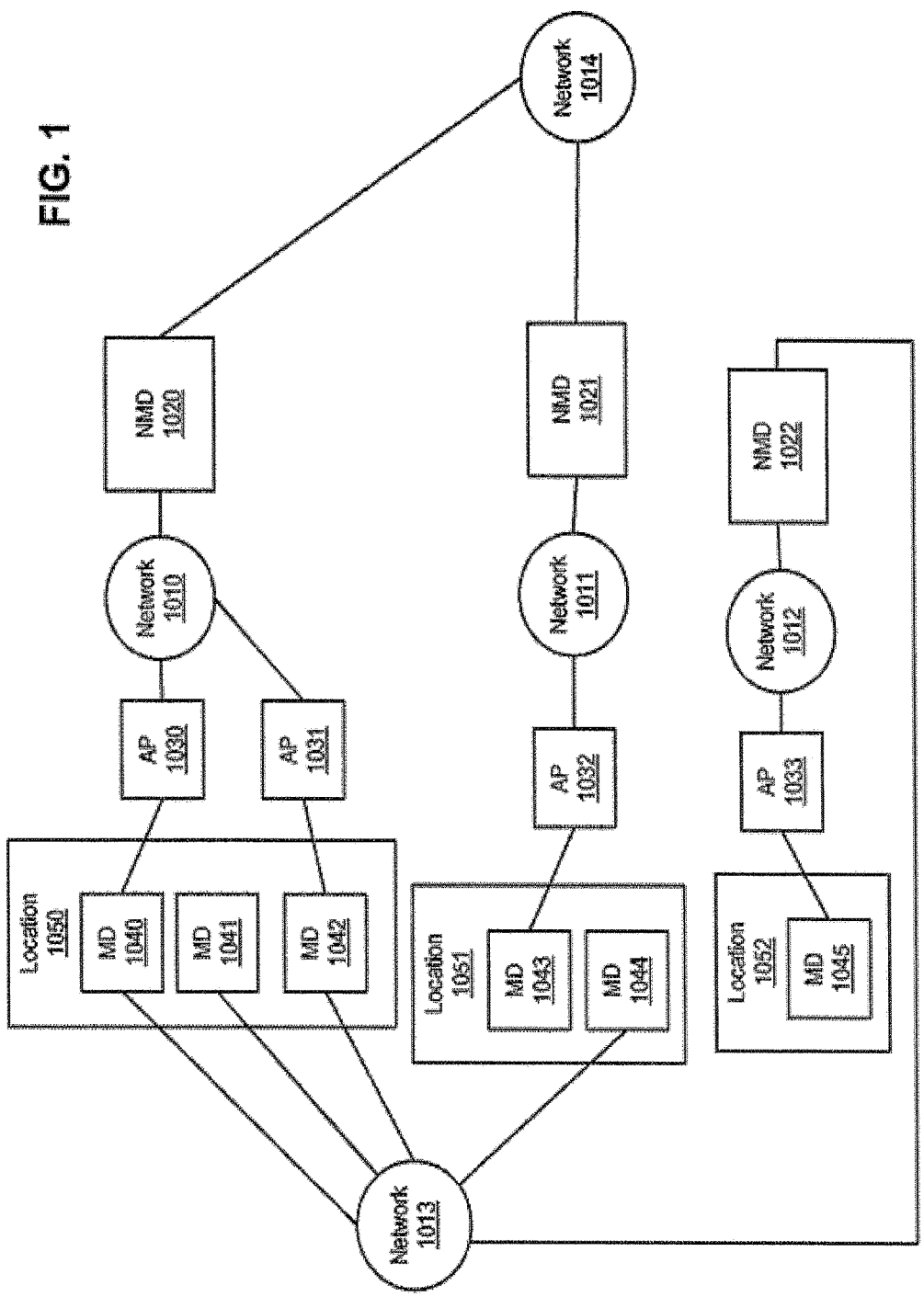
FIG. 1 provides a block diagram of a network communication system, according to one or more embodiments.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form disclosed, but on the contrary, the disclosure is to cover all modifications, equivalents and alternatives falling within the scope of the disclosure as defined by appended claims.

DETAILED DESCRIPTION

FIG. 1 illustrates a block diagram of one or more network communications systems, according to one or more embodiments. In one or more embodiments, mobile devices (MDs) 1040-1042 and 1044 can be coupled to and communicate with network 1013. For example, network 1013 can be and/or implement a telecommunications network. For instance, network 1013 can be and/or implement a wireless telecommunications network that can support one or more wireless telecommunications network protocols such as one or more of General Packet Radio Service (GPRS), enhanced data rates for GSM evolution (EDGE), long term evolution, (LTE), CDMA (code division multiple access), TDMA (time division multiple access), and/or FDMA (frequency division multiple access), among others. In one or more embodiments, network 1013 can be coupled to and/or include a telephony network that can include a wireless cellular telecommunications network and/or a wireless satellite telecommunications network. In one or more embodiments, the telephony network can communicate information such as voice and/or data.

In one or more embodiments, network 1013 can implement and/or provide access and/or services of one or more other networks. For example, network 1013 can provide access and/or services of a public network (e.g., the Internet) to one or more of MDs 1040-1042 and 1044. In one or more embodiments, network 1013 provides access and/or services of one or more other networks at a lower data rate than network 1014 can provide to one or more of MDs 1040, 1042, and 1043. For example, network 1013 can include less bandwidth than network 1014. In one or more embodiments, network 1014 can provide access and/or services of one or more other networks to MDs 1040-1044 through one or more access points (APs) and/or one or more network management devices (NMDs).

In one or more embodiments, access to these networks can include one or more "services" these networks may provide. For example, these one or more services can include one or more of: email, world wide web, file transfer, printing, file sharing, file system sharing, remote file system, network file system (NFS), news, multicast, netbios, encryption, domain name service (DNS), routing, tunneling, chat such as Internet Remote Chat and/or AOL Instant Messenger, gaming, licensing, license management, digital rights management, network time, remote desktop, remote windowing, audio, database (e.g., Oracle, Microsoft SQL Server, PostgreSQL, etc.), authentication, accounting, authorization, virtual local area network (VLAN) (e.g., IEEE 802.1q), virtual private network or VPN, audio, phone, Voice Over Internet Protocol (VoIP), paging, and video, among others. In one or more embodiments, the one or more service can be associated with and/or correspond to one or more protocols of one or more computer and/or software applications.

As shown, MDs 1040-1042 can be at a location 1050, and mobile device (MD) 1040 can be coupled to an access point (AP) 1030. MD 1042 can be coupled to an AP 1031. As illustrated, APs 1030 and 1031 can be coupled to a network 1010 that can be coupled to a network management device (NMD) 1020. In one or more embodiments, MD 1040 can be coupled to network 1010 via AP 1030, and MD 1042 can be coupled to network 1010 via AP 1031. In one or more embodiments, network 1010 can be coupled to network 1014 via NMD 1020.

In one or more embodiments, NMD 1020 can provide authentication, quality of service (QoS), communication traffic shaping, and/or access control from one or more computing devices (e.g., MDs 1040 and 1042) coupled to network 1010 through one of APs 1030 and 1031 to network 1014. For example, NMD 1020 can include an access control list that can be modifiable, and NMD 1020 can use the access control list to permit and/or deny access of one or more computing devices (e.g., MDs 1040 and 1042) to network 1014. In one or more embodiments, NMD 1020 can perform one or more processes and/or methods that can modify the access control list. In one or more embodiments, NMD 1020 can receive one or more signals from a remote signaling device, and the access control list of NMD 1020 can be modified based on the received one or more signals from the remote signaling device. In one or more embodiments, signals and/or signaling can be used in communicating establishment and/or control of communications and/or access to a network and/or resources of the network. In one or more embodiments, signals and/or signaling can be used between two different network providers or between two systems of a single network provider. In one example, a first network provider can be or include a second network provider, and signals and/or signaling can be used between the first network provider and the second network provider can mean signaling between two systems of the first network provider. In one or more embodiments, signals and/or signaling can be used to convey information (e.g., configuration messages, accounting messages, control data, etc.) that is different than user information transfer (e.g., a telephone conversation between two users, a text message communication between two users, etc.).

In one or more embodiments, network 1010 and/or network 1014 can include a wired network, a wireless network or a combination of wired and wireless networks. Network 1010 and/or network 1014 can include and/or be coupled to various types of communications networks, such as a public switched telephone network (PSTN), an Internet, a wide area network (WAN) (e.g., a private WAN, a corporate WAN, a public WAN, etc.), a local area network (LAN). In one or more embodiments, NMD 1020 can be coupled to a PSTN, e.g., Ethernet cable and DSL; a cable (television) based network; a satellite-based system; and/or a fiber based network; among others. In one or more embodiments, network 1010 and/or network 1014 can include one or more wireless networks, e.g., based on IEEE 802.11 and/or IEEE 802.16. For instance, one or more of APs 1030 and 1031 can be coupled to network 1010 in a wireless fashion. Network 1010 and/or network 1014 can include one or more DSL (digital subscriber line) and/or cable (e.g., cable television) networks and/or infrastructures. For example, network 1010 and/or network 1014 can include one or more of: cable modems, cable modem termination systems (CMTSs), satellite modems, DSL modems, digital subscriber line access multiplexers (DSLAMs), broadband remote access servers (BRASs), telecommunications circuits, and/or metropolitan area networks (MANs), among others. In one or more embodiments, network 1014 may form part of the Internet, or may couple to other networks, e.g., other local or wide area networks such as the Internet. In one or more embodiments, NMD 1020 can be a system operable to include one or more of network 1010, AP 1030, AP 1031, and/or various networking equipment, among others.

In one or more embodiments, AP 1030 can be a wired AP or a wireless AP. In one example, a wired AP can communicate with one or more computing devices (e.g., MDs 1040-1045) in a wired fashion. For instance, a wired AP can communicate with one or more computing devices (e.g., MDs 1040-1045) using wired Ethernet. In another example, a wireless AP communicates with one or more computing devices (e.g., MDs 1040-1045) in a wireless fashion. For instance, a wired AP can communicate with one or more computing devices (e.g., MDs 1040-1045) using one or more of Institute of Electrical and Electronics Engineers (IEEE) 802.16, IEEE 802.11 (wireless Ethernet), IEEE 802.15 (Bluetooth), ultra wide band, and/or infrared communication technologies, among others. In one or more embodiments, a wireless access point can include a transceiver to communicate with one or more computing devices using one or more wireless methods, processes, and/or protocols.

In one or more embodiments, each MD of MDs 1040-1045 can include and/or can be coupled to one or more transceivers that allow the MD to communicate with network 1013 and an AP of APs 1030-1033. For example, MD 1040 can include or be coupled to a first transceiver that can communicate with network 1013 and include or be coupled to a second transceiver to communicate with AP 1030. For instance, MD 1040 can include or be coupled to a first transceiver that can communicate with a cellular telephone tower of or coupled to network 1013 and include or be coupled to a second transceiver, such as a wireless Ethernet transceiver, to communicate with AP 1030.

As shown, MDs 1043 and 1044 can be at a location 1051, and MD 1043 can be coupled to an AP 1032 which can be coupled to a network 1011 that can be coupled to a NMD 1021. As also shown, MD 1045 can be at a location 1052 and can be coupled to an AP 1033 which can be coupled to a network 1012 that can be coupled to a NMD 1022. As illustrated, network management devices (NMDs) 1020 and 1021 can be coupled to network 1014, and NMD 1022 can be coupled to network 1013. In one or more embodiments, NMDs 1020 and 1021 can provide access control between respective networks 1010 and 1011 and network 1014, and NMD 1022 can provide access control between networks 1012 and network 1013. In one or more embodiments, NMDs 1021 and 1022 can include and/or implement one or more structures and/or one or more functionalities described with reference to NMD 1020. In one or more embodiments, APs 1031-1033 can include and/or implement one or more structures and/or one or more functionalities described with reference to AP 1030. In one or more embodiments, networks 1011 and 1012 can include and/or implement one or more structures and/or one or more functionalities described with reference to network 1010. In one or more embodiments, locations 1050-1052 can include one or more of hotels, airports, restaurants, geographic regions, planes, trains, automobiles, and coffee shops, among others.

Figure 2:
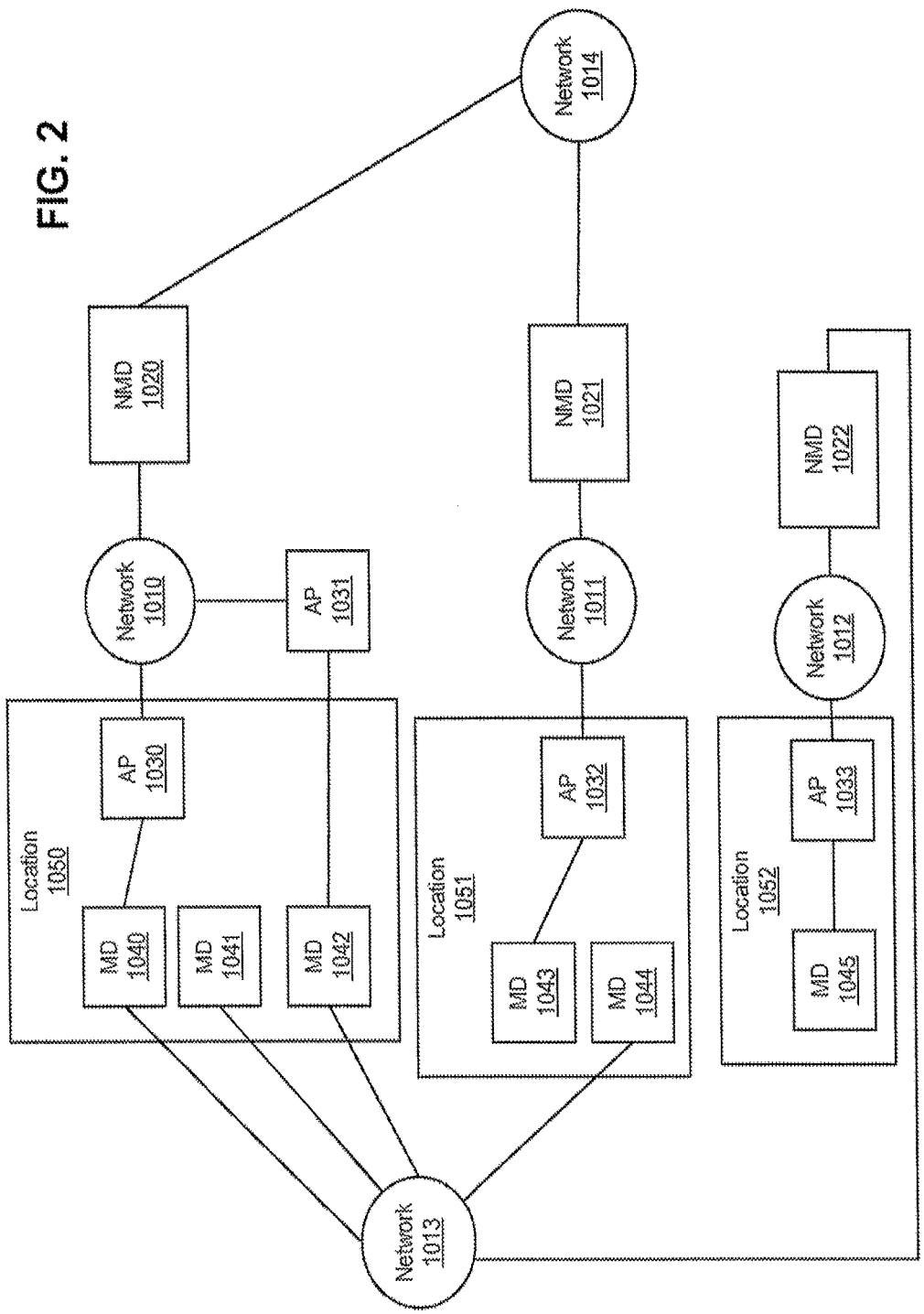
FIG. 2 provides a block diagram of a network communication system, according to one or more embodiments.

Turning now to FIG. 2, a block diagram of one or more network communications systems, according to one or more embodiments. Each of the elements illustrated in FIG. 2 is described with reference to FIG. 1. As illustrated, APs 1030, 1032, and 1033 can be at respective locations 1050, 1051, and 1052. In one or more embodiments, one or more locations of one or more of APs 1030-1033 can be stored in a database, and a location of a computing device coupled to an AP can determined using the location of the AP. For example, AP 1030 may have a limited range in which a computing device can communicate with AP 1030. For instance, AP 1030 may communicate with a computing device using wireless Ethernet which may be limited to communicating with the computing device when the computing device is within some number (e.g., tens or hundreds) of feet. For example, the database can store a location associated with location 1050 for AP 1030, and the location associated with location 1050 can be used to determine one or more locations for one or more of MDs 1040 and 1041 communicating with AP 1030. For instance, if MD 1040 is communicating with AP 1030, then it can be determined that MD 1040 is at location 1050.

In one or more embodiments, location 1052 can be or be included in a vehicle. For example, location 1052 can be or be included in a plane, train, or automobile, and location 1052 can move from one point to another point at one or more speeds and/or directions. For instance, location 1052 can be or be included in a cabin of a plane, a train car, or a passenger car.

Figure 3:
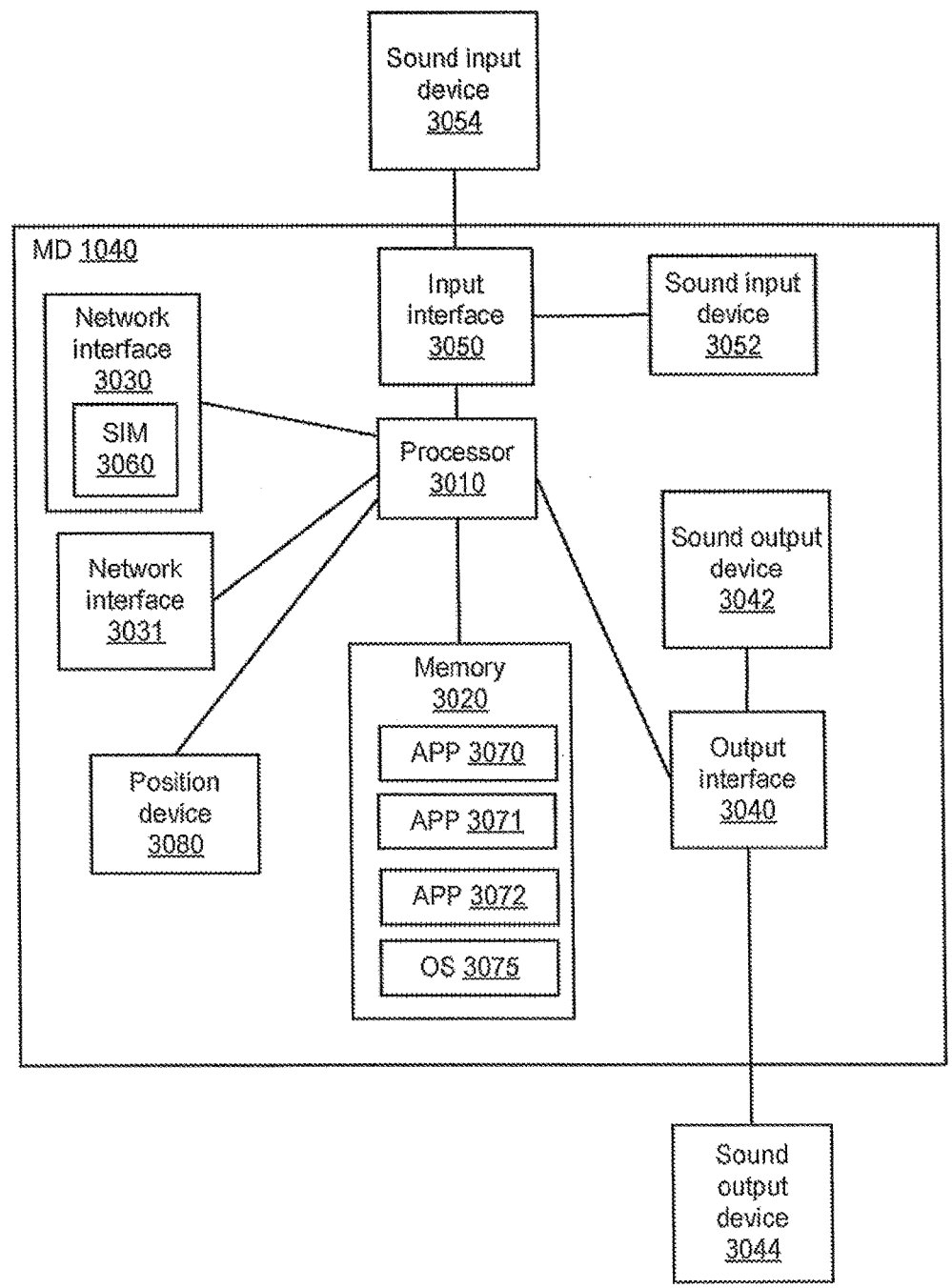
FIG. 3 provides a block diagram of a mobile device, according to one or more embodiments.

Turning now to FIG. 3, a block diagram of a mobile device is illustrated, according to one or more embodiments. As shown, MD 1040 can include a memory coupled to a processor 3010, and MD 1040 can include network interfaces 3030 and 3031, user output interface 3040, and user input interface 3050 coupled to processor 3010. In one or more embodiments, memory 3020 can include one or more applications (APPs) 3070-3072 and/or operating system (OS) 3075 that can include instructions executable by processor 3010 to implement one or more methods and/or one or more systems associated with MD 1040. In one or more embodiments, MD 1040 may be any of various types of devices, including a computer system, such as a portable computer, a personal digital assistant (PDA), a mobile telephone (e.g., a cellular telephone, a satellite telephone, etc.), a wearable computing device, an Internet appliance, a communications device, or other wired or wireless device.

In one or more embodiments, user output interface 3040 can be used to convey information (e.g., text, graphic, video, audio, etc.) to a user of MD 1040. For example, MD 1040 may include a display (e.g., a display screen) that can be used to convey text, graphic, and/or video information to a user of MD 1040. In one or more embodiments, MD 1040 can include a sound output device 3042 coupled to user output interface 3040. In one or more embodiments, sound output device 3042 can include a device and/or circuitry that can produce one or more sounds.

In one or more embodiments, a sound can be an alteration in pressure, an alteration particle displacement, and/or an alteration particle velocity that can be propagated in one or more elastic mediums. In one or more embodiments, a sound can be a superposition of one or more propagated alterations of pressure, particle displacement, and/or velocity that can be propagated in one or more elastic mediums, and one or more sounds can propagate through the one or more elastic mediums via one or more sound waves. In one or more embodiments, an intensity of a sound wave can be sound energy transmitted, and an intensity of a sound field can be sound energy transmitted per a time period through an area perpendicular to a direction of transmission at a point in a coordinate system. For example, an intensity of a sound field can be measured in ergs per second per centimeters squared.

In one or more embodiments, sound output device 3042 can include a body that can produce vibrations to create one or more sounds. For instance, sound output device 3042 can include a speaker that can produce one or more sounds, audible to a user of MD 1040, by vibrating a body (e.g., a diaphragm, a crystal, a ceramic, etc.).

In one or more embodiments, user output interface 3040 can be coupled to a sound output device 3044. In one instance, sound output device 3044 can include one or more of an amplifier and/or a speaker. In another instance, sound output device 3044 can include one or more earphones. In one or more embodiments, user output interface 3040 can be coupled to sound output device 3044 in a wired fashion. In one or more embodiments, user output interface 3040 can be coupled to sound output device 3044 in a wireless fashion. In one example, user output interface 3040 can communicate sound information to output device 3044 using an ISM (industrial, scientific, measurement) band. For instance, user output interface 3040 can communicate sound information to output device 3044 using one or more of a personal area network (PAN), IEEE (Institute of Electrical and Electronics Engineers) 802.15, IEEE 802.15.4, ZigBee, 6LoWPAN, frequency modulation of a carrier wave, amplitude modulation of a carrier wave, light signals, and serial pulses, among others. In one or more embodiments, sound output device 3044 can be or be included in a device that includes IEEE 802.15 receiver or transceiver, such as a Bluetooth headset or earpiece.

In one or more embodiments, user input interface can be used to receive user input from a user of MD 1040. In one example, MD 1040 may include a keyboard that can be used to receive user input from a user of MD 1040. In another example, MD 1040 may include a one or more sensors that can be used to receive user input from a user of MD 1040. In one instance, one or more sensors can include resistive sensors that can be used to determine one or more positions on a display screen. In another instance, one or more sensors can include capacitive sensors that can be used to determine one or more positions on a display screen. In one or more embodiments, user output interface 3040 and user input interface can be used to implement a keyboard. For example, user output interface 3040 can be used to present an image of a keyboard, and user input interface 3050 can receive a position of user input on the image of the keyboard to determine a received key of the keyboard. In one or more embodiments, MD 1040 can include a sound input device 3052 coupled to user input interface 3050.

In one or more embodiments, a sound input device can include a device and/or circuitry that can receive one or more sounds and transform the one or more sounds into one or more electrical signals (e.g., voltage and/or current). In one or more embodiments, a sound input device can include an acoustic to electric transducer or sensor that can convert one or more sounds into one or more electrical signals. For example, the acoustic to electric transducer or sensor can include a body (e.g., a diaphragm, a crystal, a ceramic, etc.) that can vibrate in response to one or more sounds (e.g., in response to sound pressure), and movement of the body can be transformed and/or converted into one or more electrical signals. For instance, a sound input device can include a microphone. In one or more embodiments, a microphone can use one or more of capacitance change (e.g., a condenser microphone), electromagnetic induction (e.g., a dynamic microphone), piezoelectric generation, and light modulation to produce one or more electrical signal from one or more mechanical vibrations.

In one or more embodiments, user input interface 3050 can be coupled to a sound input device 3054. In one instance, sound input device 3054 can include one or more of an amplifier and/or a microphone. In one or more embodiments, user input interface 3050 can be coupled to sound input device 3054 in a wired fashion. In one or more embodiments, user input interface 3050 can be coupled to sound input device 3054 in a wireless fashion.

In one example, sound input device 3054 can communicate sound information to user input interface 3050 with using an ISM band. For instance, sound input device 3054 can communicate sound information to user input interface 3050 using one or more of a PAN, IEEE 802.15, IEEE 802.15.4, ZigBee, 6LoWPAN, frequency modulation of a carrier wave, amplitude modulation of a carrier wave, light signals, and serial pulses, among others. In one or more embodiments, sound input device 3054 can be or be included in a device that includes IEEE 802.15 transmitter or transceiver, such as a Bluetooth headset or microphone.

In one or more embodiments, network interface 3030 can be used to couple MD 1040 to network 1013, and MD 1040 can use network interface 3030 to communicate information (e.g., data, voice data, etc.) with network 1013. For example, network interface 3030 can include a transceiver that is operable to communicate information with network 1013. In one or more embodiments, network interface 3030 can include a subscriber identity module (SIM) 3060. In one or more embodiments, SIM 3060 can securely store an international mobile subscriber identity (IMSI) which can include a unique number and/or identity associated with a global system for mobile communications (GSM) network and/or a universal mobile telecommunications system (UMTS) network. In one example, the unique number and/or identity can be used to determine information corresponding to MD 1040 from a home location register (HLR) and/or from a visitor location register (VLR). In one or more embodiments, a MSISDN (mobile subscriber ISDN (integrated services digital network) number, mobile station international ISDN number(s), or mobile international ISDN number) can be a number that can uniquely identify a subscription in a GSM mobile network and/or a UMTS (universal mobile telecommunications system) mobile network. For example, the MSISDN can include a telephone number corresponding to SIM 3060. In one instance, the MSISDN can include a country code, a national destination code, and a subscriber number. In another instance, the MSISDN can include a country code, a number planning area, and a subscriber number.

In one or more embodiments, SIM 3060 can be embodied in a removable card (e.g., a SIM card) that can be removed from a first MD associated with a first subscriber account and placed in a second MD, so that the second MD can be associated with the first subscriber account. For example, SIM 3060 embodied as a SIM card can be associated with a first subscriber account and used in MD 1040, thereby associating MD 1040 with the first subscriber account; SIM 3060 can be removed from MD 1040, thereby disassociating MD 1040 with the first subscriber account; and SIM 3060 can be placed in MD 1041, thereby associating MD 1041 with the first subscriber account.

In one or more embodiments, network interface 3031 can be used to communicate with an AP. For example, network interface 3031 can be used to communicate with AP 1030.

In one or more embodiments, network interface 3031 can include a transceiver that is operable to communicate information with AP 1030.

In one or more embodiments, MD 1040 can include a position device 3080 coupled to processor 3010. In one example, position device 3080 can include a global positioning system (GPS) receiver. In another example, position device 3080 can include a terrestrial radio navigation system receiver such as LORAN (LOng RAngeNavigation). In one or more embodiments, position device 3080 can provide one or more services such as one or more of positioning, navigation, and timing to processor 3010. For example, a positioning service can provide one or more of latitude information, longitude information, altitude information, and accuracy information (e.g., a radius of uncertainty for a geographic location or position).

In one or more embodiments, the term "memory" can mean a "memory medium" and/or "computer readable medium" which is intended to include various types of memory or storage, including an installation medium, e.g., a CD-ROM, or floppy disks, a random access memory or computer system memory such as DRAM, SRAM, EDO RAM, Rambus RAM, NVRAM, EPROM, EEPROM, flash memory etc., and/or a non-volatile memory such as a magnetic media, e.g., a hard drive, and/or optical storage. The memory medium can include other types of memory as well, or combinations thereof. In one or more embodiments, the memory medium can be and/or include an article of manufacture and/or a software product. In addition, the memory medium can be located in a first computer in which the programs are executed, or can be located in a second different computer and/or hardware memory device that connects to the first computer over a network. In one or more embodiments, the second computer provides the program instructions to the first computer for execution. The memory medium can also be a distributed memory medium, e.g., for security reasons, where a portion of the data is stored on one memory medium and the remaining portion of the data can be stored on a different memory medium. Also, the memory medium can include one of the networks to which the current network is coupled, e.g., a SAN (Storage Area Network).

In one or more embodiments, each of the systems described herein may take various forms, including a personal computer system, server computer system, workstation, network appliance, Internet appliance, wearable computing device, personal digital assistant (PDA), laptop, mobile telephone, mobile multimedia device, embedded computer system, television system, and/or other device. In general, the terms "computing device", "computer", and/or "computer system" can be broadly defined to encompass any device having a processor which executes instructions from a memory medium.

The memory medium in one or more systems thus can store a software program and/or data for performing and/or enabling automatic sound level control. A CPU or processing unit in one or more systems executing code and data from a memory medium includes a means for executing one or more software program according to the methods and/or flowcharts described herein.

Turning now to FIG. 4, a method that automatically determines a sound level based on an ambient sound level is illustrated, according to one or more embodiments. At 4010, two or more words can be determined. In one or more embodiments, the two or more words can be determined from a written language that can be spoken and/or verbalized from the written language. In one example, words such as "smile", "a", "of", "think", etc. can be written and spoken and/or verbalized in the English language.

In one or more embodiments, the two or more words can be determined from text data. In one example, the two or more words can be determined from a text data such as text data from a text file. In another example, the two or more words can be determined from text data from data that includes text data and at least one of image data (e.g., graphics, graphical representation of text, etc.) and metadata. For instance, the two or more words can be determined from data that includes a portable document format (PDF). In one or more embodiments, the data that includes the PDF can include one or more of text data, image data, and metadata. In one example, the data that includes the PDF can include image data that can include one or more of graphics, pictures, images, images of text, and images that include text, among others. In another example, the data that includes the PDF can include metadata that can specify where and/or how text and/or image data can be displayed. In one or more embodiments, the two or more words can be determined from image data using an optical character recognition (OCR) process.

At 4015, an ambient sound level (e.g., a sound level of a surrounding area and/or environment) can be determined. In one or more embodiments, the ambient sound level can be determined using at least one of sound input device 3052 and sound input device 3054. At 4020, an output sound level can be determined based on the ambient sound level. In one or more embodiments, the output sound level can be determined such that sounds produced by at least one of sound output device 3042 and sound output device 3044 are discernable by a user of MD 1040. In one or more embodiments, the output sound level can be determined such that sounds produced by at least one of sound output device 3042 and sound output device 3044 are not discernable to a human at a measurable distance from MD 1040. For example, the measurable distance from MD 1040 can be a few inches to a few feet.

In one or more embodiments, a configuration stored in memory 3020 can be accessed in determining the output sound level. In one example, MD 1040 can receive user input from a user of MD 1040 to indicate what one or more sounds are discernable with reference to one or more ambient sound levels, and the configuration stored in memory 3020 can be based on this user input. In one or more embodiments, the ambient sound level determined at 4015 can be compared to one or more ambient sound levels of the configuration stored in memory 3020, and the output sound level can be determined based the one or more ambient sound levels of the configuration. In one example, the output sound level can be determined based interpolation using two or more ambient sound levels of the configuration. In another example, the output sound level can be determined based extrapolation using two or more ambient sound levels of the configuration.

At 4025, sound data based on the two or more words and the determined sound level can be generated. In one or more embodiments, generating the sound data can include transforming the two or more words to speech using a text-to-speech transformation or conversion.

In one or more embodiments, generating the sound data can include generating digital sound data suitable for a digital-to-analog transformation or conversion. In one example, the digital sound data suitable for a digital-to-analog transformation or conversion can be suitable for a sigma-delta digital-to-analog transformation or conversion. In a second example, the digital sound data suitable for a digital-to-analog transformation or conversion can be suitable for pulse width modulation (PWM). In another example, the digital sound data suitable for a digital-to-analog transformation or conversion can be suitable to be transmitted to sound output device 3044. For instance, MD 1040 can communicate with sound output device 3044 in a digital format.

In one or more embodiments, generating the sound data can include generating analog sound data. In one example, generating the sound data can include transforming one or more digital sound representations of the two or more words to one or more sounds that can be discernable by a user of MD 1040. For instance, generating the sound data can include transforming one or more digital sound representations of the two or more words to one or more analog (e.g., continuous) waveforms of sound.

In one or more embodiments, generating the sound data can include using one or more filters, adders, and/or multipliers to modify and/or produce customized and/or configurable sound data. For example, using one or more filters, adders, and/or multipliers can generate the sound data such that two or more different voices can be produced. For instance, the sound data can include sum and difference frequencies introduced by the one or more filters, adders, and/or multipliers to produce different voices. In one or more embodiments, the one or more filters, adders, and/or multipliers can be implemented in program instructions that can be executed by processor 3010.

At 4030, one or more sounds can be produced based on the sound data. In one or more embodiments, sound output device 3042 can produce the one or more sounds based on the sound data. In one or more embodiments, sound output device 3044 can produce the one or more sounds based on the sound data. In one or more embodiments, 4010-4030 can be repeated to adapt to one or more environments that can include changing ambient sound levels.

Turning now to FIG. 5, a method that automatically determines a sound level based on a location is illustrated, according to one or more embodiments. In one or more embodiments, elements 5010 and 5025-5030 can be performed with respect to elements 4010 and 4025-4030 described above with reference to FIG. 4.

At 5015, a location of MD 1040 can be determined. For example, a location of locations 1050-1052 can be determined. At 5020, an output sound level (e.g., a sound level of a surrounding area and/or environment) can be determined based on the location of MD 1040. In one or more embodiments, determining the output sound level based on the location of MD 1040 can include accessing output sound level configuration data via a configuration stored in memory 3020 and/or via accessing a network (e.g., network 1013, network 1014, etc.). In one or more embodiments, the output sound level configuration data can include one or more location data and corresponding one or more output sound level data.

In one example, the output sound level configuration data can be stored in a data structure and can be indexed by location data to determine the output sound level. In one instance, the data structure can be stored in memory 3020. In another instance, the data structure can be stored in a memory of a computer system accessible via a network (e.g., network 1013, network 1014, etc.). In one or more embodiments, the location of MD 1040 may not be precisely present in the output sound level configuration data, and location data of the output sound level configuration data that is within a vicinity of the location of MD 1040 can be used to determine the output sound level. In one example, the vicinity of the location of MD 1040 can be a few feet to hundreds of feet. In another example, the vicinity of the location of MD 1040 can be hundreds of feet to one or more thousands of feet. In one or more embodiments, the output sound level configuration data can include vicinity information such that location data of the output sound level configuration data corresponds to vicinity information usable to identify appropriate location data to determine the output sound level.

In one or more embodiments, determining the output sound level can include multiplying an output sound level from the output sound level configuration data by a ratio. In one or more embodiments, the ratio can include one of a unity value (e.g., one), a value less than the unity value, and a value greater than the unity value. In one example, a first user may need a higher sound output level than another user, and the ratio can be greater than the unity value (e.g., 1.1, 1.3, 1.5, 2, 2.8, 3, etc.). In a second example, a second user may not need a sound output level as high as another user, and the ratio can be less than the unity value (e.g., 0.95, 0.9, 0.7, 0.65, 0.5, 0.3, etc.). In another example, a third user can be considered in a median or average group, and the ratio can be the unity value. In one or more embodiments, the ratio can be stored in memory 3020.

Figure 6:
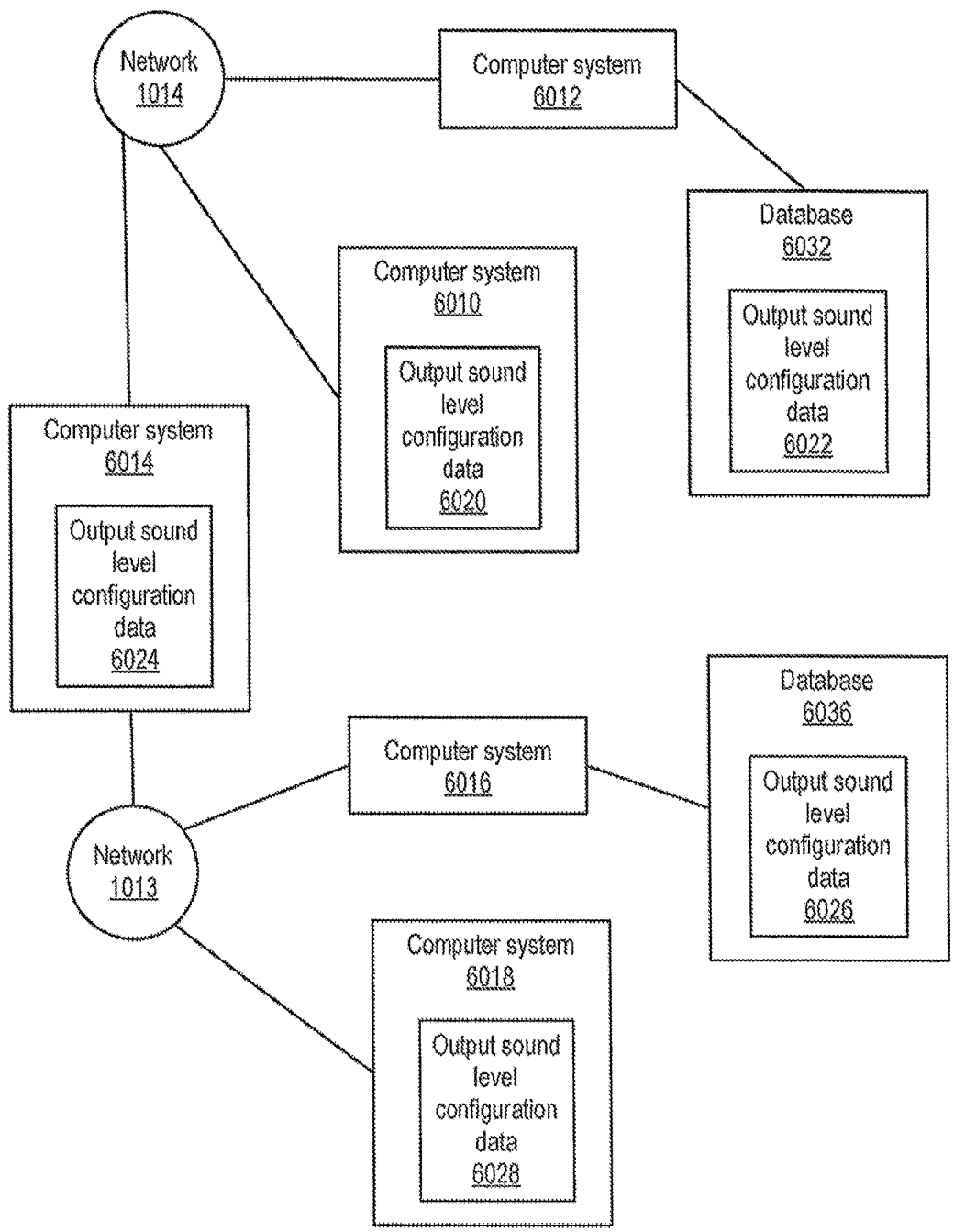
FIG. 6 provides a block diagram of one or more computer systems coupled to one or more networks, according to one or more embodiments.

Turning now to FIG. 6, a block diagram of one or more computer systems coupled to one or more networks is illustrated, according to one or more embodiments. As illustrated, computer systems 6010-6014 can be coupled to network 1014, and computer systems 6010 and 6014 can include respective output sound level configuration data 6020 and 6024. Computer system 6012 can be coupled to a database 6032 that can include output sound level configuration data 6022, and computer system 6012 can access output sound level configuration data 6022 using database 6032, according to one or more embodiments. In one example, database 6032 can include a relational database management system (RDBMS). In another example, database 6032 can provide one or more portions of output sound level configuration data 6022 in response to one or more queries. In one or more embodiments, one or more portions of output sound level configuration data 6020-6024 can be provided to one or more mobile devices (e.g., MDs 1040, 1042, and 1043) coupled to network 1014.

As shown, computer systems 6014-6018 can be coupled to network 1013, and computer system 6018 can include output sound level configuration data 6028. Computer system 6016 can be coupled to a database 6036 that can include output sound level configuration data 6026, and computer system 6016 can access output sound level configuration data 6026 using database 6036, according to one or more embodiments. In one example, database 6036 can include a RDBMS. In another example, database 6036 can provide one or more portions of output sound level configuration data 6026 in response to one or more queries. In one or more embodiments, one or more portions of output sound level configuration data 6024-6028 can be provided to one or more mobile devices (e.g., MDs 1040-1042, 1044, and 1045) coupled to network 1013.

Figure 7:
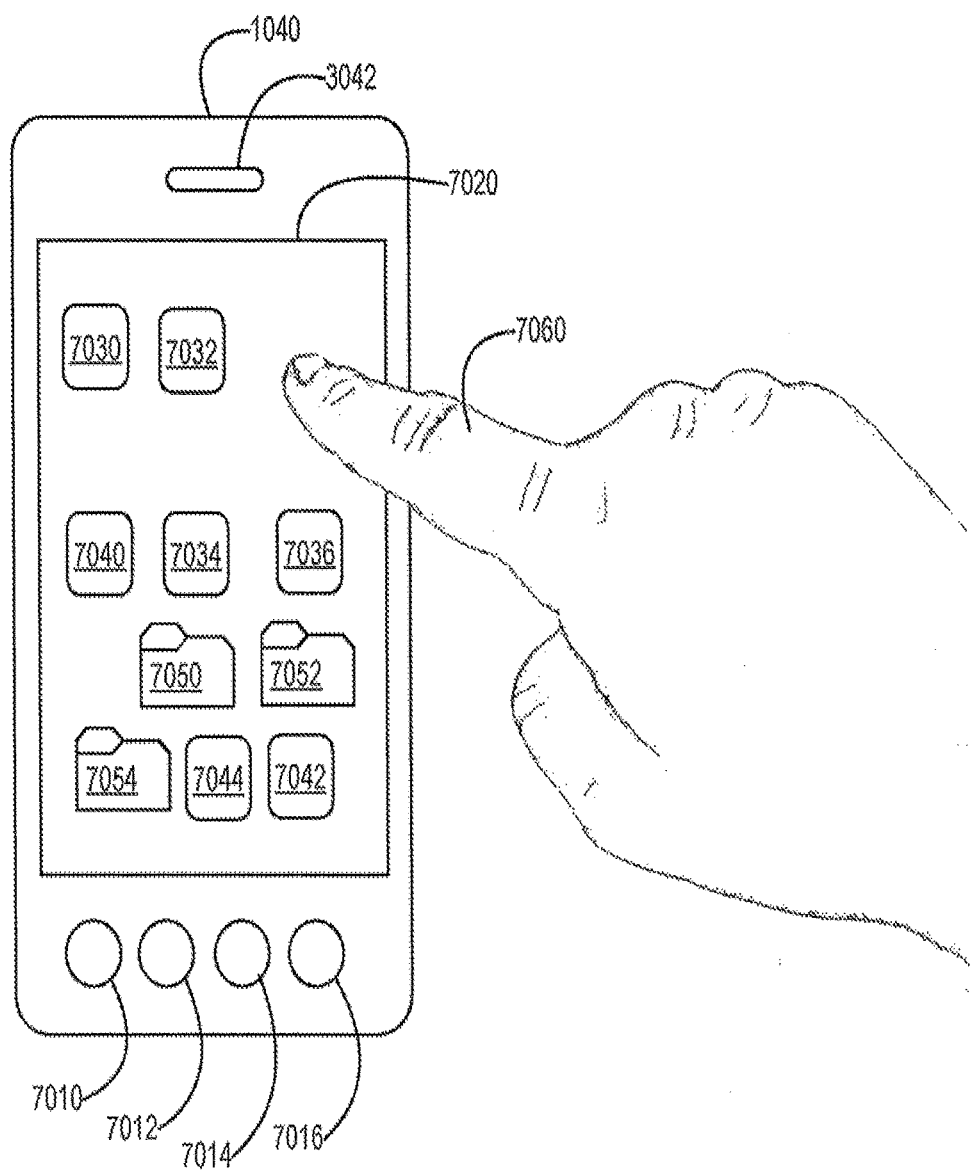
FIGS. 7-10 provide block diagrams of a mobile device, a portion of a user of the mobile device, and a drag and drop process, according to one or more embodiments.

Turning now to FIGS. 7-10, diagrams of a mobile device and a portion of a user of the mobile device are illustrated, according to one or more embodiments. As shown in FIG. 7, MD 1040 can include one or more user selectable buttons 7010-7016. In one or more embodiments, buttons 7010-7016 can be coupled to input interface 3050. MD 1040 can include a touch screen 7020 that can be coupled to output interface 3040 and input interface 3050. As illustrated, icons 7030-7054 can be displayed by touch screen 7020. In one or more embodiments, one or more of icons 7030-7054 can be selected by a digit (e.g., a finger) 7060 or other appendage of a user of MD 1040 and/or one or more of icons 7030-7054 can be selected by a stylus (not shown). In one or more embodiments, icons 7030-7036 can represent files, icons 7040-7046 can represent applications (e.g., applications 3070-3072), and icons 7050-7056 can represent folders (e.g., folders or directories of a file system).

In one or more embodiments, digit 7060 can drag an icon of icons 7030-7054 from a first portion of screen 7020 by selecting the icon, moving digit 7060 to a second portion of screen 7020, and removing digit 7060. In one example, digit 7060 can be kept in contact with screen 7020 or in close proximity to screen 7020 while dragging the icon. In another example, digit 7060 can select the icon, be removed from screen 7020, and select a portion of screen 7020. In one or more embodiments, digit 7060 can drag an icon an icon of icons 7030-7044 to an icon of folder icons 7050-7056. In one or more embodiments, a drag and drop process can include dragging a first icon associated with a file or application to a second icon associated with a folder.

Figure 8:
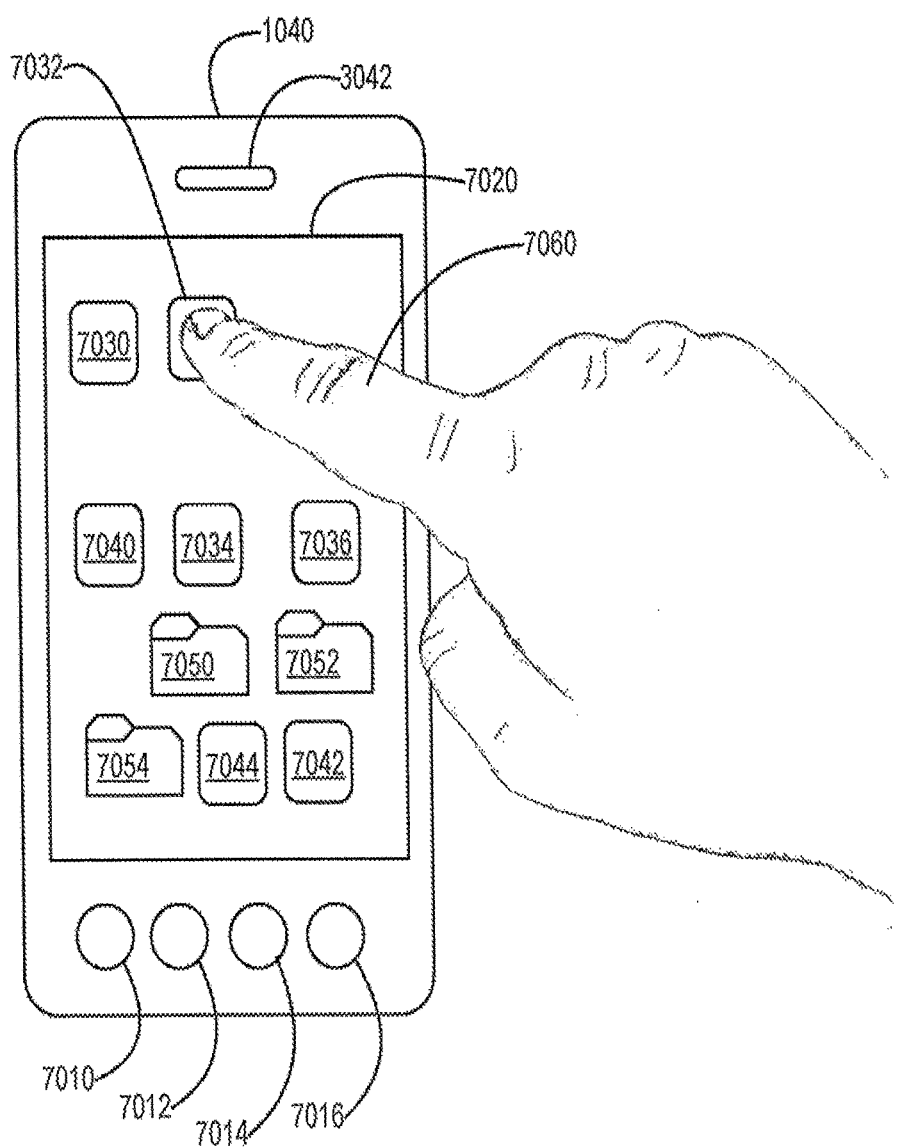
Figure 9:
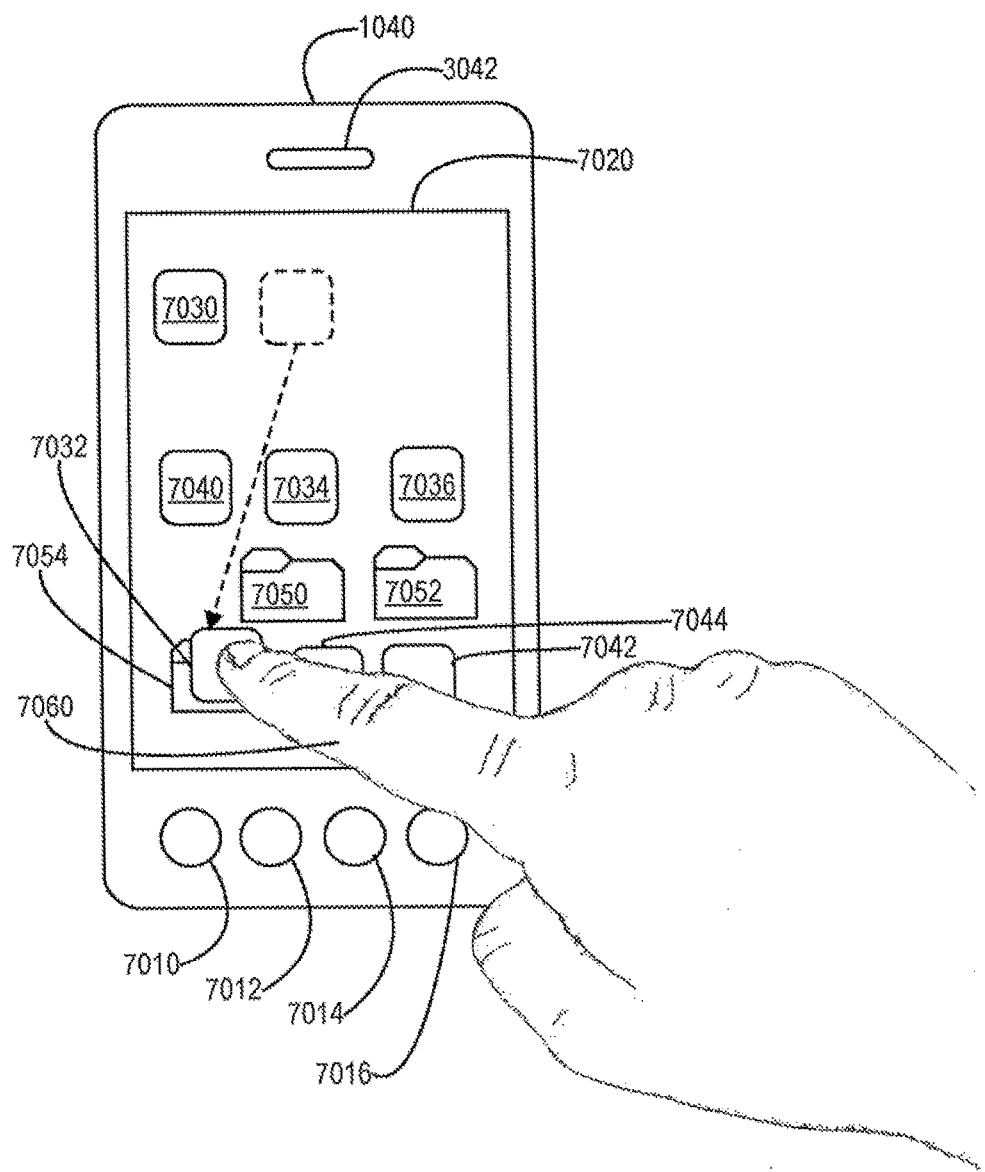
Figure 10:
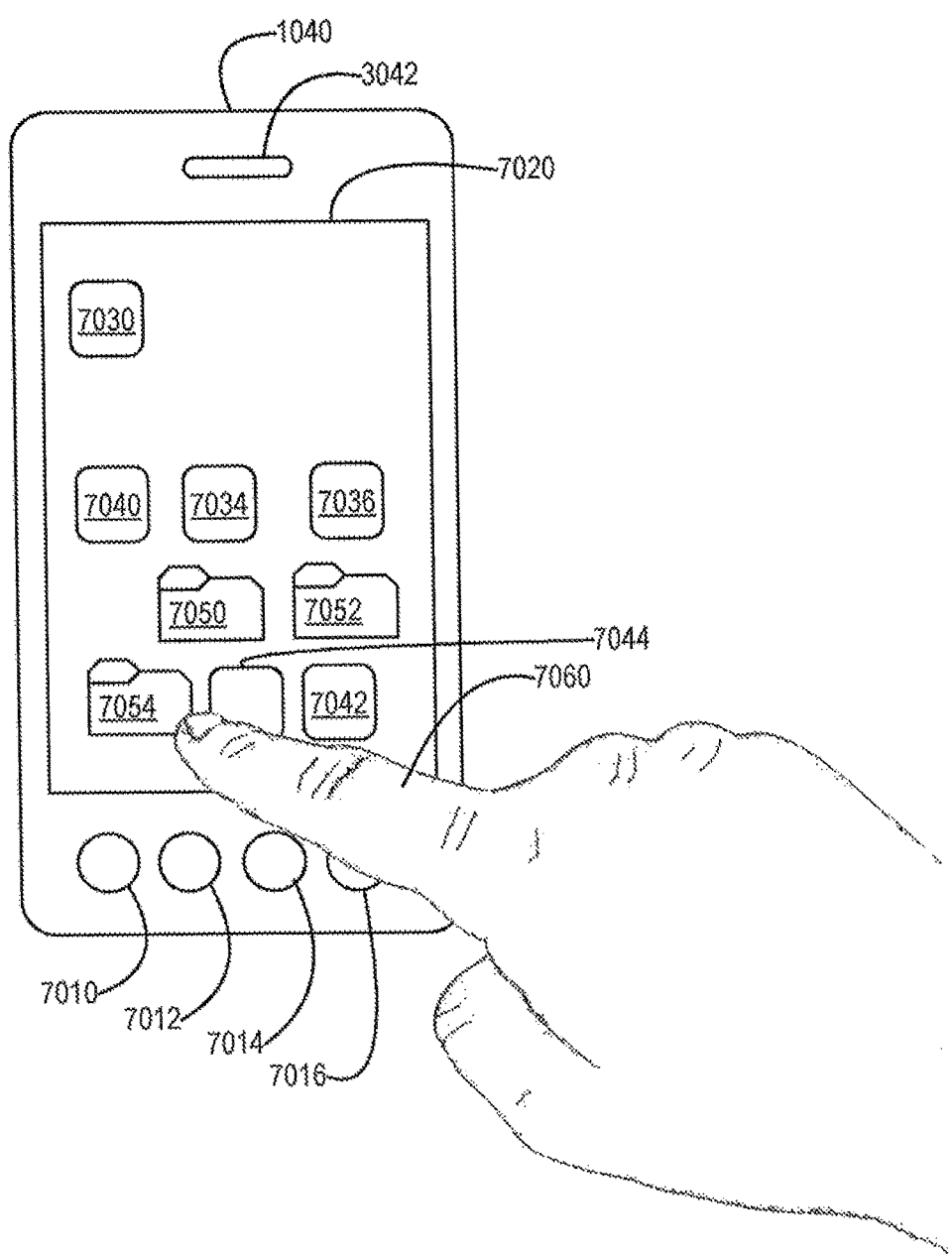

As illustrated in FIG. 8, digit 7060 can select icon 7032 and can drag icon 7032 to icon 7054, as shown in FIG. 9. FIG. 10 illustrates that a file associated with icon 7032 has been dropped into a folder associated with icon 7054 as a result of a drag and drop process. In one or more embodiments, in response to dropping a file associated with icon 7032 into a folder associated with icon 7054, one or more methods and/or processes can be performed using the file associated with icon 7032.

Turning now to FIG. 11, a method of indexing and/or tagging text of a file is illustrated, according to one or more embodiments. At 11010, a file can be received. In one or more embodiments, the file can be received through a file system operation. In one example, the file system operation can include moving or copying the file into a folder or directory. For instance, the file can be received from a drag and drop process. At 11015, words from the file can be determined. In one or more embodiments, 11015 can be performed with respect to 4010 of FIG. 4. At 11020, key words can be determined. In one or more embodiments, key words can include one or more of verbs, names, and proper nouns, among others.

At 11025, the file can be indexed based on the key words. In one or more embodiments, index data can be created. For example, the index data can include one or more of the key words, one or more positions in the file where a key word occurs, and a time stamp, among others. For instance, the index data can be used to search the file in one or more of a forward fashion and a reverse fashion. In one or more embodiments, searching the file in one or more of a forward fashion and a reverse fashion can be used to skip over one or more portions of the file such that the skipped one or more portions of the file are not output as one or more sounds. At 11030, the index data can be stored. In one or more embodiments, the index data can be stored in memory 3020. In one example, the index data can be stored in a data structure. In a second example, the index data can be stored in a flat file (e.g., a data structure within a file). In another example, the index data can be stored in a database. For instance, the database can be stored in one or more of memory 3020, database 6032, and database 6036.

Turning now to FIG. 12, a method of searching a file is illustrated, according to one or more embodiments. At 12010, user input indicating a search of a file and at least one key word can be received. At 12015, a search process can be determined. In one or more embodiments, the search process can include a forward search or a reverse search. In one or more embodiments, using the determined search process to search the file in one or more of a forward fashion and a reverse fashion can be used to skip over one or more portions of the file such that the skipped one or more portions of the file are not output as one or more sounds. At 12020, the file can be searched using the determined search process, index data associated with the file, and the at least one key word. At 12025, a in the file at the at least one key word can be determined, and a transformation of text in the file to speech starting at the position can proceed at 12030.

It is noted that, in one or more embodiments, one or more of the method elements described herein and/or one or more portions of an implementation of a method element may be performed in varying orders, can be performed concurrently with one or more of the other method elements and/or one or more portions of an implementation of a method element, or can be omitted. Additional method elements can be performed as desired. In one or more embodiments, concurrently can mean simultaneously. In one or more embodiments, concurrently can mean apparently simultaneously according to some metric. For example, two or more method elements and/or two or more portions of an implementation of a method element can be performed such that they appear to be simultaneous to a human. It is also noted that, in one or more embodiments, one or more of the system elements described herein may be omitted and additional system elements can be added as desired.

Further modifications and alternative embodiments of various aspects of the disclosure may be apparent to those skilled in the art in view of this description. Accordingly, this description is to be construed as illustrative only and is for the purpose of teaching those skilled in the art the general manner of carrying out the operations described in the disclosure. It is to be understood that the forms shown and described herein are to be taken as embodiments. Elements and materials may be substituted for those illustrated and described herein, parts and processes may be reversed, and certain features in the disclosure may be utilized independently, all as would be apparent to one skilled in the art after having the benefit of this description in the disclosure. Changes may be made in the elements described herein without departing from the scope of the disclosure as described in the following claims.

What is claimed is:

1. A method comprising:
   identifying, by a computing device, a plurality of words from data;
   determining, at the computing device, a location of the computing device;
   determining, at the computing device, a sound output level based on the location;
   generating, by the computing device, digital sound data based on the sound output level and the plurality of words identified from the data; and
   outputting sound from an output device based on the digital sound data, the output device coupled to the computing device.

2. The method of claim 1, wherein the output device comprises a speaker of the computing device or a headset.

3. The method of claim 1, wherein the determining the sound output level comprises accessing output sound configuration network data based on the location from a server.

4. The method of claim 1, wherein the determining the sound output level comprises accessing output sound configuration network data based on the location from a memory of the computing device.

5. The method of claim 1, wherein the data includes image data, and wherein at least one word of the plurality of words is identified from the image data.

6. The method of claim 5, wherein the at least one word is identified using optical character recognition.

7. The method of claim 1, wherein at least one of the plurality of words is obtained from a data file.

8. The method of claim 7, wherein the data file comprises a portable document format file.

9. The method of claim 1, wherein the generating the digital sound data includes using a filter, an adder, a multiplier, or combinations thereof.

10. The method of claim 1, wherein the determining the location of the computing device includes utilizing a global positioning system receiver.

11. The method of claim 1, wherein the determining the location includes use of a terrestrial radio navigation system receiver.

12. A computing device comprising:
    a speaker;
    a processor coupled to the speaker; and
    a memory accessible to the processor, the memory including instructions that, when executed by the processor, cause the processor to perform operations, the operations comprising:
    identifying a plurality of words in data;
    determining a location associated with the processor;
    determining a sound output level based on the location;
    generating digital sound data based on the sound output level and the plurality of words; and
    outputting sound from the speaker based on the digital sound data.

13. The computing device of claim 12, wherein the generating the digital sound data includes using a filter, an adder, a multiplier, or combinations thereof.

14. The computing device of claim 12, wherein the determining the sound output level includes accessing output sound configuration network data based on the location from the memory.

15. The computing device of claim 12, wherein the determining the location includes basing the location on a location of an access point of a network, the access point in communication with the processor.

16. A computer-readable storage device storing instructions that, when executed by a processor, cause the processor to perform operations, the operations comprising:
    identifying a plurality of words in data;
    determining a location associated with the processor;
    determining an ambient sound level;
    determining a sound output level based on the location and the ambient sound level;
    generating digital sound data based on the sound output level and the plurality of words; and
    outputting sound from an output device based on the digital sound data, the output device coupled to the processor.

17. The computer-readable storage device of claim 16, wherein the determining the sound output level includes basing the sound output level on a noise level determined from the ambient sound level.

18. The computer-readable storage device of claim 16, wherein the determining the sound output level comprises accessing output sound configuration network data based on the location from a server.

19. The computer-readable storage device of claim 16, wherein the plurality of words is identified from image data, a data file, or both.

20. The computer-readable storage device of claim 16, wherein the output device comprises a speaker or a headset.

\* \* \* \* \*